United States Patent [19]

Kearney

[11] Patent Number: 4,463,319

[45] Date of Patent: Jul. 31, 1984

[54] OPERATIONAL AMPLIFIER CIRCUIT

[75] Inventor: Mark B. Kearney, Kokomo, Ind.

[73] Assignee: General Motors Corporation, Detroit, Mich.

[21] Appl. No.: 404,580

[22] Filed: Aug. 2, 1982

[51] Int. Cl.³ .............................................. H03F 3/45
[52] U.S. Cl. .................................... 330/258; 330/261
[58] Field of Search .............. 330/252, 255, 258, 260, 330/261

[56] References Cited

U.S. PATENT DOCUMENTS 3,745,477  1/1972  Freeborn .............................. 330/255

Primary Examiner—James B. Mullins
Assistant Examiner—G. Wan
Attorney, Agent, or Firm—Howard N. Conkey

[57] ABSTRACT

An operational amplifier includes a PNP differential amplifier operable for low common mode input voltages and an NPN differential amplifier operable for high common mode input voltages so that the operational amplifier is operable over a range of common mode input voltages that includes substantially the positive and negative supply voltages.

2 Claims, 1 Drawing Figure

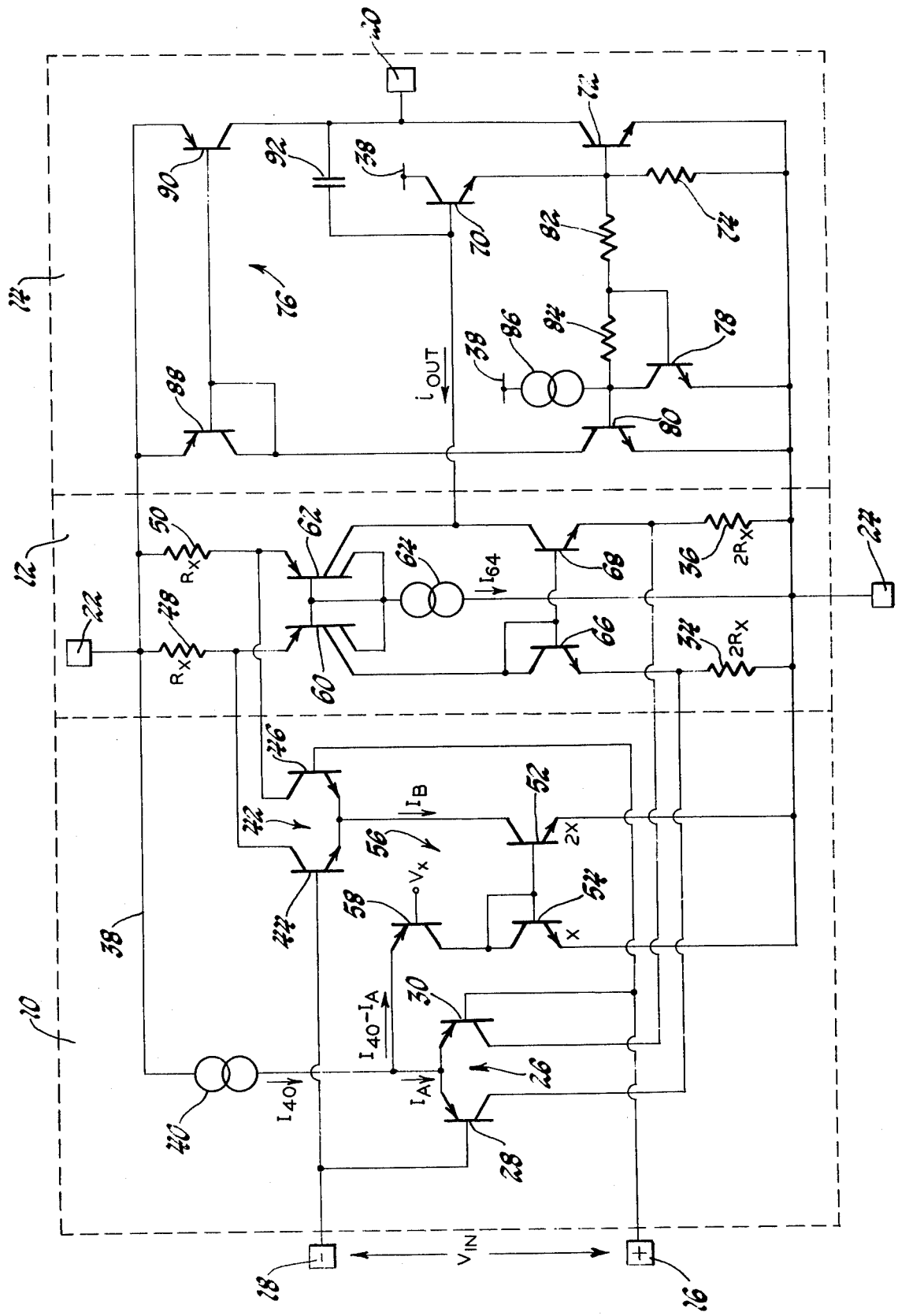

OPERATIONAL AMPLIFIER CIRCUIT

BACKGROUND OF THE INVENTION

This invention relates to an operational amplifier circuit operative over a range of common mode input voltages including substantially the amplifier positive and negative supply voltages.

The common mode input voltage range over which conventional bipolar transistor operational amplifiers operate is generally limited to common mode input voltages (the average of the input voltages to the amplifier) offset from the positive or negative voltage of the amplifier power supply. This input voltage limitation is due principally to the transistor emitter-base junctions between the input terminals and the positive or negative power supply terminal in the input bipolar transistor differential amplifier stage. For example, if the input differential amplifier stage is a PNP transistor differential amplifier, the PNP transistors are biased off when the input voltages are within the base-emitter junction voltage of the positive supply voltage so that the amplifier is unresponsive to the input voltages. Conversely, if the input differential amplifier stage is an NPN transistor differential amplifier, the NPN transistors are biased off when the input voltages are equal to or less than the base-emitter junction voltage (relative to the negative supply voltage) so that the amplifier is ineffective to compare the input voltages.

In some operational amplifier applications, it may be desirable to have the capability to respond to common mode input voltages that extend over a range that includes substantially the negative and positive amplifier supply voltages.

SUMMARY OF THE INVENTION

It is the general object of this invention to provide an improved operational amplifier having an extended common mode input voltage range of operation.

It is another object of this invention to provide an operational amplifier that is responsive to common mode input voltages over a range including substantially the negative and positive amplifier supply voltages.

In general, the operational amplifier of this invention includes two input differential amplifier stages. One of the stages is a PNP differential amplifier operative in response to common mode input voltages approaching substantially the negative supply voltage to the operational amplifier. The other stage is an NPN differential amplifier operative in response to common mode input voltages approaching substantially the positive supply voltage to the operational amplifier so that the operational amplifier is operative over a range of common mode input voltages that includes substantially the positive and negative supply voltages to the operational amplifier.

BRIEF DESCRIPTION OF THE DRAWING

The invention may be best understood by reference to the drawing which is a schematic diagram of a monolithic integrated operational amplifier circuit incorporating the principles of this invention.

DESCRIPTION OF THE PREFERRED EMBODIMENT

Referring to the drawing, a monolithic integrated operational amplifier circuit is basically comprised of a differential input stage 10, a differential-to-single-ended translation stage 12 and an output stage 14. The circuit includes a positive signal input terminal 16, a negative signal input terminal 18, an output terminal 20, a positive supply terminal 22 for connection to the positive terminal of an external DC voltage source and a negative supply terminal 24 for connection to the negative terminal of the DC voltage source.

The input differential stage 10 includes a PNP differential amplifier 26 comprised of PNP transistors 28 and 30. The operational amplifier positive and negative input terminals 16 and 18 are coupled to the inputs to the PNP differential amplifier 26 at the bases of the transistors 30 and 28, respectively. The collectors of the transistors 28 and 30, across which the output of the PNP differential amplifier 26 is provided, are coupled to the negative supply terminal 24 through resistors 34 and 36, respectively, in the differential-to-single-ended translation stage 12. The emitters of the transistors 28 and 30 are coupled together and to a positive supply rail 38 via a current source 40. The positive supply rail 38 in turn is connected to the positive supply terminal 22.

The differential input stage 10 also includes an NPN differential amplifier 42 comprised of NPN transistors 44 and 46. The operational amplifier positive and negative input terminals 16 and 18 are coupled to the inputs to the NPN differential amplifier 42 at the bases of the transistors 46 and 44, respectively. The collectors of the transistors 44 and 46, across which the output of the NPN differential amplifier is provided, are coupled to the positive supply rail 38 via resistors 48 and 50, respectively, in the differential-to-single-ended translation stage 12. The emitters of the transistors 44 and 46 are coupled together and to the negative supply terminal 24 through an NPN transistor 52 which, in conjunction with a diode connected NPN transistor 54, forms a current mirror in a crossover stage 56. The emitter area of transistor 52 is made twice that of transistor 54 so that transistor 52 collector-emitter current is twice that of transistor 54.

The emitter of a PNP transistor 58 in the crossover stage is coupled to the emitters of the transistors 28 and 30 in the PNP differential amplifier 26 and its base is connected to a reference voltage $V_x$. The voltage $V_x$ may be generated, for example, by a voltage divider formed by a pair of resistors coupled between the positive supply rail 38 and the negative supply terminal 24. The reference voltage $V_x$ is at a voltage intermediate the supply voltages at the positive and negative supply terminals 22 and 24 and is at least offset from the voltage at the positive supply rail 38 by an amount greater than the emitter-base junction voltage of the PNP transisors 28 and 30 and at least offset from the voltage at the negative supply terminal 24 by an amount greater than the base-emitter junction voltage of the transistors 44 and 46 in the NPN differential amplifier 42. The collector of the transistor 58 is coupled to the diode connected transistor 54. As will be described in the operational description of the operational amplifier, the crossover stage 56 functions to selectively enable either the PNP differential amplifier 26 or the NPN differential amplifier 42 as a function of the input voltages applied to the positive and negative input terminals 16 and 18 relative to the reference voltage $V_x$.

The differential-to-single-ended translation stage 12 includes a pair of dual collector PNP transistors 60 and 62 whose emitters are coupled to the positive supply rail 38 through the resistors 48 and 50, respectively. The bases and one of the collectors of each of the transistors 60 and 62 are coupled together and to the negative supply terminal 24 via a current sink 64. The remaining collectors of the transistors 60 and 62 are coupled to the negative supply terminal via a current mirror formed by a diode connected NPN transistor 66 and an NPN transistor 68 and the resistors 34 and 36. The differential-to-single-ended translation stage 12 receives as its input the differential output across the collectors of the transistors 28 and 30 in the PNP differential amplifier 26 or the collectors of the transistors 44 and 46 in the NPN differential amplifier 42, depending on which of the differential amplifiers 26 and 42 is enabled by the crossover stage 56. The output signal of the differential-to-single-ended translation stage 12 is provided at the collector of the NPN transistor 68. The resistance of each of the resistors 48 and 50 is equal to a value $R_x$ and the resistance of each of the resistors 34 and 36 is equal to $2R_x$.

An input NPN transistor 70 in the output stage 14 receives the output signal from the differential-to-single-ended translation stage 12 at its base and controls an output NPN transistor 72. In this respect the collector of the transistor 70 is coupled to the positive rail 38 and its emitter is coupled directly to the base of the transistor 72 and to the negative supply terminal 24 through a resistor 74. The collector and emitter of the transistor 72 are coupled between the output terminal 20 and the negative supply terminal 24.

The transistor 70 also controls a current mirror 76 in an opposite sense to the transistor 72 via a pair of NPN transistors 78 and 80. In this respect, the emitter of the transistor 70 is coupled to the base of the transistor 78 through a resistor 82. A further resistor 84 is coupled between the collector and base of the transistor 78 whose emitter is coupled to the negative supply terminal 24. The transistor 70 variably controls conduction of the transistor 78 which in turn controls the conduction of the transistor 80 by variably shunting drive current from the base of the transistor 80 provided by a current source 86 coupled to the positive supply rail 38. The collector and emitter of the transistor 80 are coupled between the cathode of a diode connected transistor 88 in the current mirror 76 and the negative supply terminal 24 and controls the current from the positive supply rail 38 through the diode connected transistor 88. A PNP transistor 90 in the current mirror 78 has its emitter-base junction connected in parallel with the emitter-base junction of the transistor 88 and its collector coupled to the output terminal 20. The collector current of the transistor 90 is established by the transistor 70 (via the transistors 78 and 80) and varies in an opposite sense to the conduction of the transistor 72.

A feedback capacitor 92 is coupled between the output terminal 20 and the input to the output stage 14 at the base of the transistor 70 so that the output stage 14 takes the form of an inverting integrator.

The operation of the operational amplifier of the drawing will now be described. Initially, it is to be noted that (1) the PNP differential amplifier 26 is incapable of responding to differences in the input voltages applied to the positive and negative input terminals 16 and 18 when they are both offset from the voltage at the positive supply rail 38 by an amount less than the emitter-base junction voltage of the transistors 28 and 30 and (2) the NPN differential amplifier 42 is incapable of responding to differences in the voltages applied to the positive and negative supply terminals 16 and 18 when they are both offset from the voltage at the negative supply terminal 24 by an amount less than the base-emitter junction voltage of the transistors 44 and 46. Therefore, if the differential input stage 10 were comprised of a single differential amplifier, the operational amplifier would be limited in its operation by at least a base-emitter junction voltage offset from the voltage at either the positive or negative supply terminals 22 or 24.

In accord with this invention, the differential input stage includes both PNP and NPN differential amplifiers which are selectively enabled by the crossover stage 56 so that the operational amplifier will respond to common mode input voltages over a range that substantially includes the voltages at the positive and negative supply terminals 22 and 24. This is accomplished by the crossover stage 56 enabling the PNP differential amplifier 26 for low common mode input voltages and the differential amplifier 42 for high common mode input voltages.

In this embodiment, the crossover stage 56 enables the PNP differential amplifier 26 when both of the input voltages at the input terminals 16 and 18 are below the reference voltage $V_x$ at the base of the transistor 58. When this condition exists, the base-emitter junction of the transistor 58 is reverse biased and the current mirror comprised of the transistors 52 and 54 is disabled so that a current path is not provided for the NPN differential amplifier 42 which is therefore also disabled.

When the PNP differential amplifier 26 is enabled, either the transistor 28 or 30 is conducting depending upon the relative values of the signal supplied to the input terminals 16 and 18. If the signal at the positive terminal 16 is greater than the signal at the negative terminal 18, the transistor 30 is biased less conductive and the transistor 28 is biased more conductive. The increased voltage at the emitter of the transistor 66 in the differential-to-single-ended stage 12 is reflected to the base of the transistor 68 which is biased more conductive to reduce the bias current supplied by the transistor 70 to the output transistor 72 and the transistor 78. Accordingly, the transistor 72 is biased less conductive and the bias current to the transistor 80 shunted by the transistor 78 is increased to increase the collector current of the transistor 90 in the current mirror 76. The combined decreased conduction of the transistor 72 and increased conduction of the transistor 90 provides a high output signal at the output terminal 20. Conversely, when the voltage at the negative terminal 18 is greater than the voltage at the positive terminal 16, the transistor 28 is biased nonconductive and the transistor 30 is biased conductive. When this condition exists, the conduction of the transistor 68 is decreased to increase the voltage at the output of the differential-to-single-ended translation stage 12. This results in increased bias current via the transistor 70 to the transistor 72 and decreased collector current from the transistor 90 in the current mirror 76 to provide a low output signal at the output terminal 20.

The PNP differential amplifier 26 is operative even with common mode input voltages at the input terminals 16 and 18 approaching ground potential and is limited only by the saturation voltage of the transistors 28 and 30.

When both of the voltages at the terminals 16 and 18 increase above the reference voltage $V_x$, the transistor 58 is biased conductive. When conductive, the transistor 58 reverse biases the transistors 28 and 30 in the differential amplifier 26 which is therefore disabled. At the same time, the current mirror formed by the transistors 52 and 54 is enabled to provide a current path to enable the NPN differential amplifier 42. This amplifier then responds to the relative values of the signals applied to the positive and negative input terminals 16 and 18.

When the differential amplifier 42 is enabled, if the signal at the positive terminal 16 is greater than the negative terminal 18, transistor 46 is biased more conductive and the transistor 44 is biased less conductive. When this condition exists, the collector current of transistor 62 decreases to below the collector current of transistor 60 so that the transistor 68 decreases the bias current to the transistor 70. As previously described, this results in a decrease in conduction of the transistor 72 and an increase in the conduction of the transistor 90 to raise the voltage at the output terminal 20.

Conversely, when the voltage at the negative input terminal 18 is greater than the voltage at the positive input terminal 16, the transistor 44 conducts more current than the transistor 46. When this condition exists, the collector-to-emitter voltage of the transistor 68 increases to increase the bias current supplied to the transistor 70. As previously described this results in an increase in the conduction of the transistor 72 and a decrease in the conduction of the transistor 90 to lower the voltage at the output terminal 20.

The NPN differential amplifier 42 is operative even with common mode input voltages at the input terminals 16 and 18 substantially equal to the voltage at the positive rail 38 and is limited only by the saturation voltage of the transistors 44 and 46. By the combined action of the differential amplifiers 26 and 42, the operational amplifier is responsive to common mode voltages over the range that substantially includes the positive and negative supply voltages provided to the positive and negative supply terminals 22 and 32.

The input transconductance $G_M$ of the differential input and translation stages 10 and 12 is defined by the expression $i_{out}/V_{in}$ where $i_{out}$ is the output current of the translation stage and $V_{in}$ is the input voltage across the input terminals 16 and 18. It is desirable that $G_M$ be the same for all three of the operating regions of the input stages which are: (A) the PNP differential amplifier 26 enabled and the NPN differential amplifier 42 disabled, (B) the NPN differential amplifier 42 enabled and the PNP differential amplifier 26 disabled and (C) both differential amplifiers 26 and 42 enabled, which condition exists when the voltages at the input terminals 16 and 18 are both approximately equal to $V_x$. In the operational amplifier above described, $G_M$ is the same for all three operating regions. This can be shown as follows:

The transconductance, $G_M$, of the differential input and translation stages 10 and 12 is equal to the expression $$\frac{\frac{R_x}{4V_t}(2I_A + I_B)}{R_x + \frac{V_t}{I_{64}}} \quad (1)$$

where $R_x$ is the resistance of each of the resistors 48 and 50 and one half the resistance of each of the resistors 34 and 36, $V_t$ is Bolzmann's constant times the absolute temperature divided by the charge of an electron, $I_A$ is the sum of the emitter currents of the transistors 28 and 30, $I_B$ is the sum of the emitter currents of the transistors 44 and 46, and $I_{64}$ is the current of the current sink 64.

In the operating region (A) above, $I_B$ is zero and the transconductance $G_M$ of expression (1) becomes $$\frac{\frac{R_x}{2V_t} \cdot I_A}{R_x + \frac{V_t}{I_{64}}} \quad (2)$$

In the operating region (B) above, $I_A$ is zero and the transconductance $G_M$ of expression (1) becomes $$\frac{\frac{R_x}{4V_t} \cdot I_B}{R_x + \frac{V_t}{I_{64}}} \quad (3)$$

Therefore, for $G_M$ to be the same for both operating regions (A) and (B), $I_A$ in operating region (A) must equal $I_B/2$ in operating region (B). This condition is met by making the emitter area of transistor 52 in the crossover stage 56 twice the emitter area of the transistor 54. This emitter area ratio also establishes the relationship $$I_B = 2I_{40} - 2I_A \quad (4)$$

where $I_{40}$ is the current supplied by the current source 40. By substituting expression (4) into expression (1), the expression for the transconductance $G_M$ of the differential input and translation stages 10 and 12 for all three operating regions becomes $$G_M = \frac{\frac{R_x}{2V_t} \cdot I_{40}}{R_x + \frac{V_t}{I_{64}}} \quad (5)$$

The foregoing expression (5) for the tranconductance $G_M$ is independent of the currents $I_A$ and $I_B$ and therefore the same for all three operating regions, and is established by providing an emitter area of the transistor 52 twice the emitter area of the transistor 54, by making the resistances of the resistors 48 and 50 equal, and by making the resistances of the resistors 34 and 36 equal and twice the resistance of the resistors 48 and 50.

While the differential amplifiers 26 and 42 are illustrated as being selectively enabled in accord with the voltages at the input terminals 16 and 18 relative to the reference voltage $V_x$, other ways of selectively enabling the differential amplifiers 26 and 42 are contemplated. For example, one voltage level may be provided for enabling the differential amplifier 26 when one of the input voltages approaches ground potential and a second voltage level for enabling the differential amplifier 42 when one of the voltages approaches the voltage of the positive rail 38. Other variations of the circuit are contemplated. The description of the preferred embodiment for the purpose of illustrating the invention is not to be considered as limiting or restricting the invention since many modifications may be made by the exercise of skill in the art without departing from the scope of the invention.

The embodiments of the invention in which an exclusive property or privilege is claimed are defined as follows:

1. An operational amplifier comprising, in combination:

positive and negative voltage supply terminals;

positive and negative input terminals for receiving input signal voltages to the operational amplifier;

an NPN differential amplifier including a pair of NPN transistors having emitter electrodes coupled together and to the negative supply terminal, base electrodes each coupled to a respective one of the positive and negative input terminals and collector electrodes, the NPN differential amplifier providing an output signal between its collector electrodes in accord with the relative values of input signal voltages applied to the positive and negative input terminals over a range including common mode signal voltages substantially equal to the voltage at the positive supply terminal;

a PNP differential amplifier including a pair of PNP transistors having emitter electrodes coupled together and to the positive supply terminal, base electrodes each coupled to a respective one of the positive and negative input terminals and collector electrodes, the PNP differential amplifier providing an output signal between its collector electrodes in accord with the relative values of input signal voltages applied to the positive and negative input terminals over a range including common mode input signal voltages substantially equal to the voltage at the negative supply terminal;

means responsive to input signal voltages at the input terminals for enabling the NPN transistor differential amplifier for operation with high common mode input signal voltages and to enable the PNP transistor differential amplifier for operation with low common mode input signal voltages; and an output translation stage for providing an output signal in accord with the voltage across the collector electrodes of the enabled differential amplifier, whereby the operational amplifier provides an output signal in accord with the relative values of input signal voltages applied to the positive and negative input terminals for common mode input signal voltages ranging between substantially the voltages at the positive and negative supply terminals.

2. An operational amplifier comprising, in combination:

positive and negative voltage supply terminals;

positive and negative input terminals for receiving input voltages to the operational amplifier;

an NPN transistor differential amplifier coupled between the positive and negative supply terminals and having a first pair of inputs coupled to the positive and negative input terminals, the NPN transistor differential amplifier providing a first differential output signal having a value in accord with the relative values of input voltages over a range including common mode input voltages substantially equal to the voltage at the positive supply terminal;

a PNP transistor differential amplifier coupled between the positive and negative supply terminals and having a second pair of inputs coupled to the positive and negative input terminals, the PNP transistor differential amplifier providing a second differential output signal having a value in accord with the relative values of input voltages over a range including common mode input voltages substantially equal to the voltage at the negative supply terminal;

means responsive to input voltages at the input terminals for enabling the NPN transistor differential amplifier for operation with high common mode input voltages and enabling the PNP transistor differential amplifier for operation with low common mode input voltages; and an output stage for providing an operational amplifier output signal in accord with the first and second differential output signals, whereby the operational amplifier provides an output signal in accord with the relative values of input voltages applied to the positive and negative input terminals including common mode input voltages over substantially the full range between the voltages at the positive and negative supply terminals.

* * * * *